(12) United States Patent
Jang et al.

(10) Patent No.: US 6,271,123 B1
(45) Date of Patent: Aug. 7, 2001

(54) CHEMICAL-MECHANICAL POLISH METHOD USING AN UNDOPED SILICON GLASS STOP LAYER FOR POLISHING BPSG

(75) Inventors: Syun-Ming Jang, Hsin-Chu; Chung-Long Chang, Dou-Liu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/086,769

(22) Filed: May 29, 1998

(51) Int. Cl.$^7$ ..................................................... H01L 21/44
(52) U.S. Cl. ........................ 438/633; 438/672; 438/692; 438/699
(58) Field of Search ........................ 438/633, 692, 438/672, 699, 634

(56) References Cited

U.S. PATENT DOCUMENTS

| | | | |
|---|---|---|---|
| 5,169,491 | * 12/1992 | Doan | 156/636 |
| 5,314,843 | 5/1994 | Yu et al. | 437/225 |
| 5,332,467 | 7/1994 | Sune et al. | 156/636 |
| 5,356,513 | * 10/1994 | Burke et al. | 156/636 |
| 5,449,314 | 9/1995 | Meikle et al. | 451/41 |
| 5,560,802 | 10/1996 | Chisholm | 156/636.1 |
| 5,580,825 | * 12/1996 | Labunov et al. | 437/194 |
| 5,893,734 | * 4/1999 | Jeng et al. | 438/239 |
| 5,928,959 | * 7/1999 | Huckels et al. | 438/691 |
| 5,963,837 | * 10/1999 | Ilg et al. | 438/760 |
| 5,998,249 | * 12/1999 | Liaw et al. | 438/238 |
| 6,063,506 | * 5/2000 | Andricacos et al. | 428/546 |

* cited by examiner

Primary Examiner—Mary Wilczewski
Assistant Examiner—David Goodwin
(74) Attorney, Agent, or Firm—George O. Saile; Stephen B. Ackerman; William J. Stoffel

(57) ABSTRACT

A method using chemical-mechanical polishing for planarizing a BPSG layer 30 using a overlying Undoped Silicate Glass (USG) cap layer 40 comprising:

(a) form a BPSG layer 30 over the semiconductor structure 12; the BPSG layer 30 over the periphery area 16 having a first thickness;

(b) form a cap layer 40 composed of undoped silicon glass (USG) over the BPSG layer 30; the cap layer has a thickness that is at less than half of the first thickness of the BPSG layer; the top surface of the cap layer 40 in the cell area 14 is higher than the top surface of the BPSG layer 30 in the periphery area 16;

(c) chemical-mechanical polish the cap layer 40 and the BPSG layer 30 over the cell area using the cap layer 40 over the periphery area 16 to retard the chemical-mechanical polish process when the top surface of the BPSG layer 30 over the cell area 14 is even with the cap layer 40 over the periphery area 16; and the cap layer 40 remains over the Periphery area 16.

3 Claims, 4 Drawing Sheets

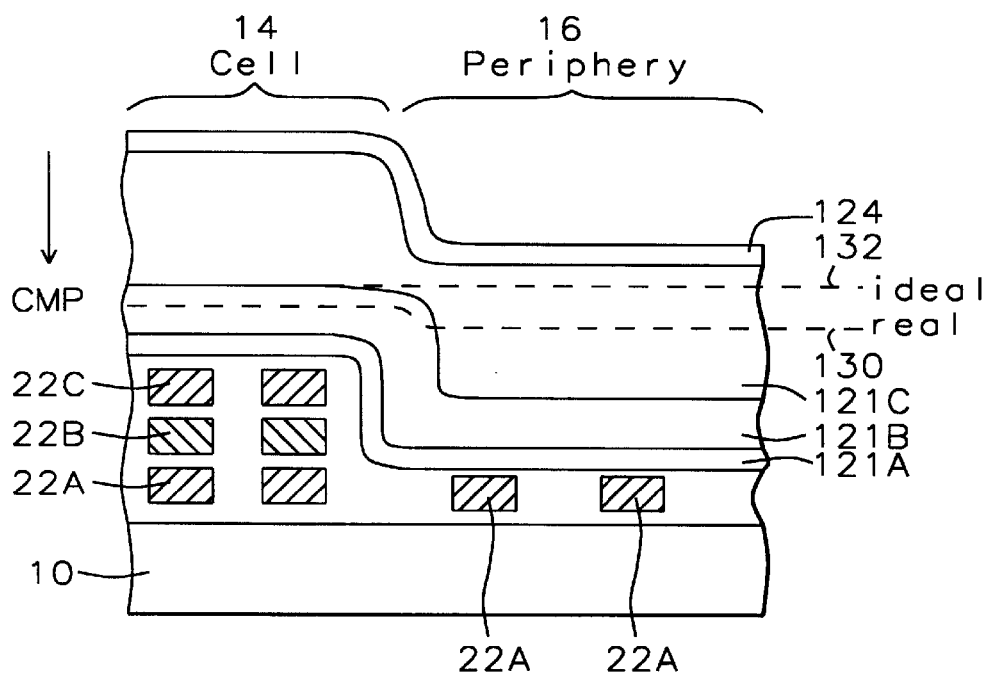
FIG. 1 – Prior Art
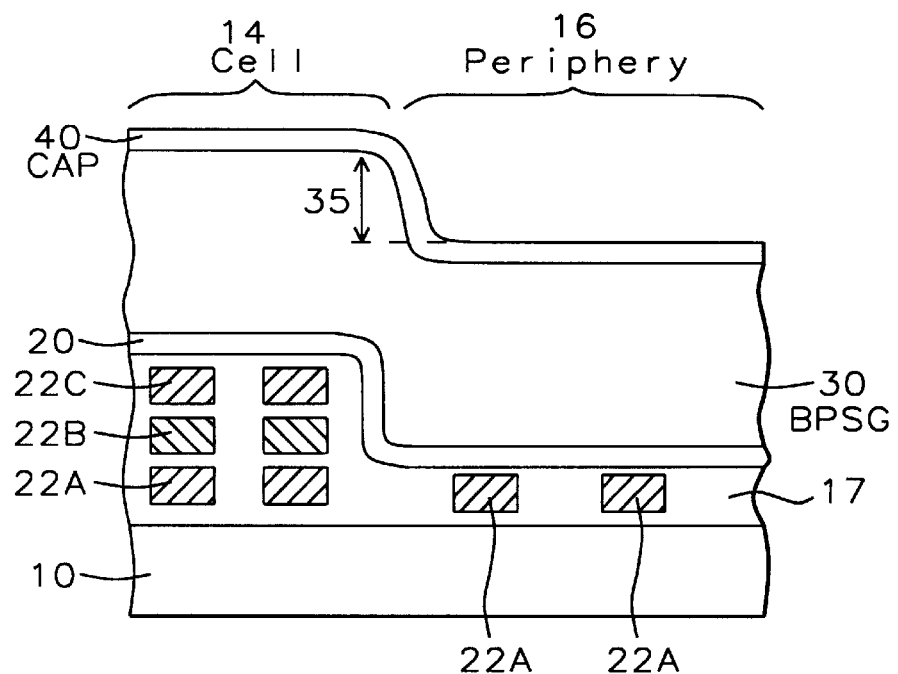
FIG. 2

CHEMICAL-MECHANICAL POLISH METHOD USING AN UNDOPED SILICON GLASS STOP LAYER FOR POLISHING BPSG

BACKGROUND OF THE INVENTION

1) Field of the Invention

This invention relates to semiconductor manufacture and more particularly to an improved method of chemical mechanical polishing and for forming planarized dielectric layers.

2) Description of the Prior Art

One technique that is used in semiconductor manufacture for planarizing dielectric layers is chemical mechanical polishing (CMP). Chemical-mechanical polishing involves holding and rotating a semiconductor wafer against a wetted polishing platen under controlled chemical, pressure and temperature conditions. Typically an aqueous colloidal silica solution is used as the abrasive fluid. The polishing mechanism is a combination of mechanical action and the chemical reaction of the material being polished with the aqueous solution. As circuit densities increase, chemical mechanical polishing has become one of the most viable techniques for planarization particularly for interlevel dielectric layers. In view of this, improved methods of chemical mechanical polishing are being increasingly sought. One aspect of chemical mechanical polishing in need of improvement is the speed and throughput of the process for semiconductor manufacture. In general, CMP is a relatively slow and time consuming process. During the polishing process semiconductor wafers must be individually loaded into a carrier, polished and then unloaded from the carrier. The polishing step in particular is very time consuming and may require several minutes.

Recently, different techniques have been used in the art for increasing the speed and throughput of the CMP process. As an example, more aggressive aqueous solutions have been developed to increase the speed of the polishing step. Higher carrier downforces and higher rpms for the polishing platen are also sometimes used. Although these techniques are somewhat successful, they may adversely effect the polishing process and the uniformity of the polished surface. Endpoint detection, for instance, is more difficult to control when aggressive solutions and higher carrier downforces are employed. In addition, the polishing process may not proceed uniformly across the surface of the wafer. The hardness or composition of a dielectric layer (or polishing platen) may vary in certain areas. This in turn may cause a dielectric layer to polish faster or slower in some areas effecting its global planarity. This problem may be compounded by aggressive solutions, higher carrier downforces and increased rpms.

In view of these and other problems of prior art CMP processes, there is a need in the art for improved methods of CMP. In addition, there is a need in the art for improved methods of forming and planarizing dielectric layers.

The applicants have found problems in their previous CMP planarization process for ILD layers. This process is not prior art, but an explanation of a problem that the invention solves. As shown in FIG. 1, an inter level dielectric (ILD) layer 121 is formed over polysilicon layers 22A 22B 22C over a substrate 10. The substrate has a high cell area 14 and a lower periphery area 16. The applicant's inter level dielectric (ILD) layer 121 was formed of three layers: a lower PE-TEOS layer 121A, a middle thin BTTEOS layer 121B and a thick PE-TEOS layer 121C. A stop layer 124 composed of SiN was formed over this ILD layer 121.

Next, the stop layer 124 and the ILD layer 121 are chemical-mechanical polished as shown in figure 1A. The ideal CMP result 132 (top surface of IDL layer 121 after CMP) is shown as line 132. However, when the SiN layer 124 and the IDL layer 121 were chemical-mechanical polished, the actual resulting surface is shown as dotted line 130. The real surface 130 of the IDL layer 121 after CMP is caused by 1̂polish pad dishing and 2̂wafer non-uniformity.

Due to the great difference in step height from cell 14 to periphery circuits 16, the oxide polishing of IPO and ILD layers 121 in embedded DRAM or SRAM suffers poor within-cell and cell-to-periphery planarity. (See dotted line 132). To resolve this issue, PE-SIN cap layer 124 on ILD 121 (for example, PE-TEOS/BP 03-TEOS )PE-TEOS 121A, 121B, 121C) has been proven viable to improve the global planarity. However, the use of PE-TEOS in ILD or IPO has been found to induce device degradation. The PE-TEOS layer 121 causes excess moisture that results in device degradation. Furthermore, BPSG or BP 03-TEOS is highly preferred as the polishing layer. Moreover, the residual PE-SIN stop layer 124 is unwanted and requires additional wet etch step to remove it completely. Compared with BPSG, the SiN stop layer 124 has much lower polish rate and may not be able to achieve good planarity. Therefore, a stop layer that is compatible with BPSG and can be left after CMP is desired.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,169,491 (Doan) teaches forming a forming a BPSG layer over the USG layer and (3) CMP the BPSG layer. U.S. Pat. No. 5,449,314 Meikle et al.) shows a method of CMP planarization where a dielectric layer has a dopant concentration that decreases with depth. (See col. 3, lines 35 to 40). U.S. Pat. No. 5,356,513 (Burke) shows a method of forming alternating soft/hard/soft planarization layers. U.S. Pat. No. 5,314,843 (Yu et al.) shows a method of forming dielectric layerover a substrate and doping specific (high) areas of the dielectric layer to make the CMP rate higher in the doped areas. The areas are doped using a masking process. U.S. Pat. No. 5,332,467 (Sune) shows a CMP method that forms hard polish stops over an oxide layer. U.S. Pat. No. 5,560, 802 (Chisholm) shows another CMP method using silicon oxide stop and doped upper layers.

SUMMARY OF THE INVENTION

It is an object of the present invention to provide an improved method of chemical-mechanical polish (CMP) and an improved method of forming and planarizing dielectric layers using chemical-mechanical polish (CMP).

It is a further object of the present invention to provide an method of planarizing a BPSG layer 30 using an overlying Undoped Silicate Glass (USG) cap layer 40.

It is a further object of the present invention to provide an improved method of CMP that is suitable for large scale semiconductor manufacture and in which increased process speeds and throughput are obtained without sacrificing global planarity.

It is an object of the invention to minimize the amount of PE-TEOS layer remaining after the chemical-mechanical polishing thereby reducing device degradation.

The invention is at least a two layer structure comprising a thick BGSG layer 30 and a thin USG cap layer 40. The cap layer 40 can remain on the BPSG layer 30 after the CMP process. A key point of the invention is that the top surface of the cap layer 40 in the cell area 14 is higher than the top surface of the BPSG layer 30 in the periphery area 16 (see FIG. 2 element 35).

Accordingly, the invention provides a method of planarizing a BPSG layer 30 using a thin USG cap layer 40; comprising the steps of:

- (a) See FIG. 2—providing a semiconductor structure 18 over a substrate 10; the semiconductor structure 18 having at least a cell area 14 and a periphery area 16; the top surface of the semiconductor structure 18 in the cell area 14 being higher than in the periphery area 16;
- (b) forming a first silicon oxide layer 20 using a PE-TEOS process over the semiconductor structure 18;
- (c) forming a BPSG layer 30 on the first silicon oxide layer; the BPSG layer 30 over the periphery area 16 having a first thickness;
  - (c-1) the BPSG layer 30 has the first thickness in a range of between about 3000 and 15,000 Å;
- (d) forming a cap layer 40 composed of undoped silicon glass (USG) over the BPSG layer 30;
  - (d-1) the cap layer 40 is composed of undoped silicon glass (USG); and the cap layer 40 having a thickness in a range of between about 500 and 2000 Å;
  - (d-2) A key point of the invention is that the top surface of the cap layer 40 in the cell area 14 is higher than the top surface of the BPSG layer 30 in the periphery area 16 (see FIG. 2 element 35).
  - (d-3) The cap layer preferably has a thickness that is at less than half of the first thickness of the BPSG layer.
- (e) See FIG. 3A—chemical-mechanical polishing the cap layer 40 and the BPSG layer 30 over the cell area using the cap layer 40 over the periphery area 16 to retard the chemical-mechanical polish process when the top surface of the BPSG layer 30 over the cell area 14 is even with the cap layer 40 over the periphery area 16; and the cap layer 40 remaining over the Periphery area 16; The BPSG layer 30 over the cell area 14 has a thickness 30A in a range of between about 1000 and 5000 Å.
- (f) See FIG. 3B—The cap layer 40 can be completely removed by chemical-mechanical polish;
- (g) See FIGS. 4 & 5—conductive layers 50 of metal or polysilicon can be formed over the planarized BPSG layer 30.

This invention uses Undoped Silicate Glass (USG) 40 as CMP cap layer together with BPSG IDL layer 30 as polish layer to enhance the global planarity and prevent device degradation. Data shows that the CMP selectivity of BPSG/USG is about 3:1—which similar to the ratio of PE-TEOS to SiN. This selectivity has been proven good for planarization. Additionally, unlike PE-SIN 124 which must be removed completely during or after polishing, the USG cap layer 40 can remain on the BPSG layer 30 in the finished product. Thus, an etching step, which would remove the SiN stop layer, is saved in the invention's process.

The invention has the following key features and provides the following benefits:

1. Within-cell area 14 and cell (14)-to-periphery (16) planarity by chemical-mechanical polish (CMP) is improved.
2. CVD and chemical-mechanical polish (CMP) throughputs are increased.
3. No additional etch step is required to removed the residual cap layer 40 (compare with etch step needed remove SiN stop layer 124). See FIG. 1.
4. (See FIG. 2 element 35) The top surface of the cap layer 40 in the cell area 14 is higher than the top surface of the BPSG layer 30 in the periphery area 16. This ensures that the BPSG layer 30 over the cell area 14 is chemical-mechanical polished without interference from the cap layer 40. This speeds up the CMP process while increasing the planarity of the surface.
5. The thickness of the thin cap layer 40 is a key parameter. The cap layer preferably has a thickness that is at less than half of the first thickness of the BPSG layer and more preferably less than ⅓ of the thickness of the BPSG layer. The cap layer thickness is preferably between 300 and 2000 Å and more preferably between 800 and 1200 Å.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A is a cross sectional view of a ILD layer and SIN cap layer of the applicant's prior process. This figure explains a problem with an previous experimental process the inventor tried, but is not prior art for patent processing purposes.

FIGS. 2, 3A, 3B, and 4 are cross sectional view of a semiconductor structure having the invention's BPSG and USG cap layer showing the CMP planarization process of the present invention.

DETAILED DESCRIPTION OF THE PREFERRED EMBODIMENTS

The present invention will be described in detail with reference to the accompanying drawings. The present invention provides a method of fabricating a planarized BPSG layer over a semiconductor structure. The invention can be summarized as shown in the table below:

TABLE

Summary of major steps of the invention:

| | |
|---|---|
| FIG. 2 - | forming a first silicon oxide layer 20 using a PE-TEOS process over the semiconductor structure 18; |
| FIG. 2 - | forming a BPSG layer 30 over first silicon oxide layer 20; |
| FIG. 2 | forming a Undoped Silicate Glass (USG) cap layer 40 over the BPSG layer 20; the USG cap layer 30 has a chemical-mechanical polish rate ratio to the BPSG layer in a range of between about 2:1 and 4:1 |
| • | The thickness of the thin cap layer 40 is a key parameter. The cap layer preferably has a thickness that is at less than half of the first thickness of the BPSG layer and more preferably less than ⅓ of the thickness of the BPSG layer. The cap layer thickness is preferably between 300 and 2000 |

TABLE-continued

Figure 3A:
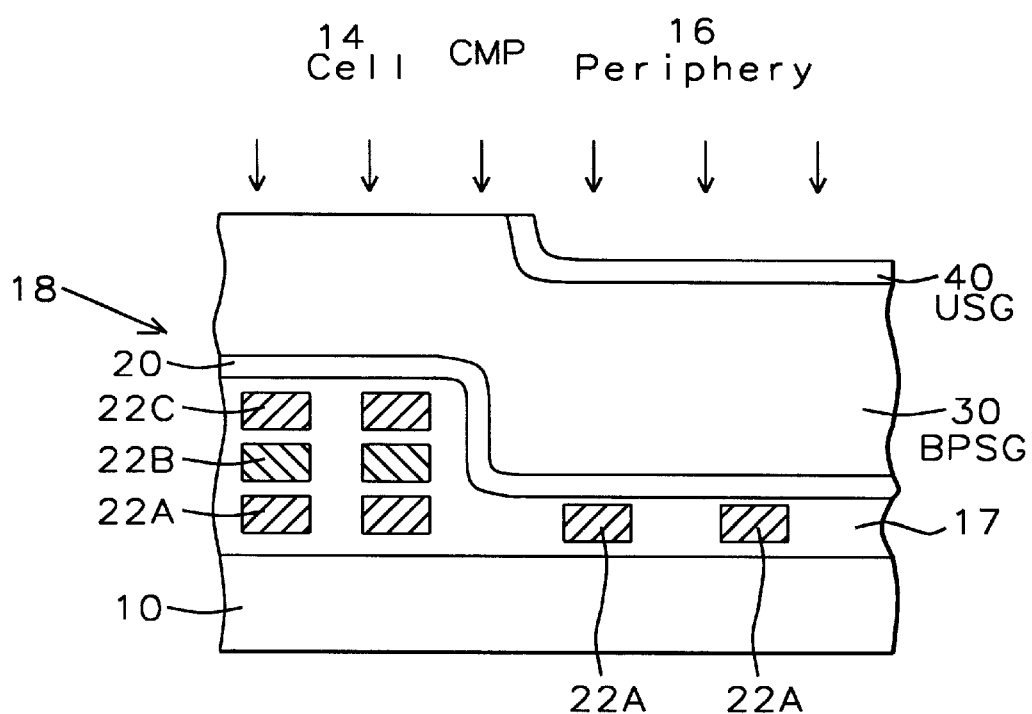
Figure 3B:
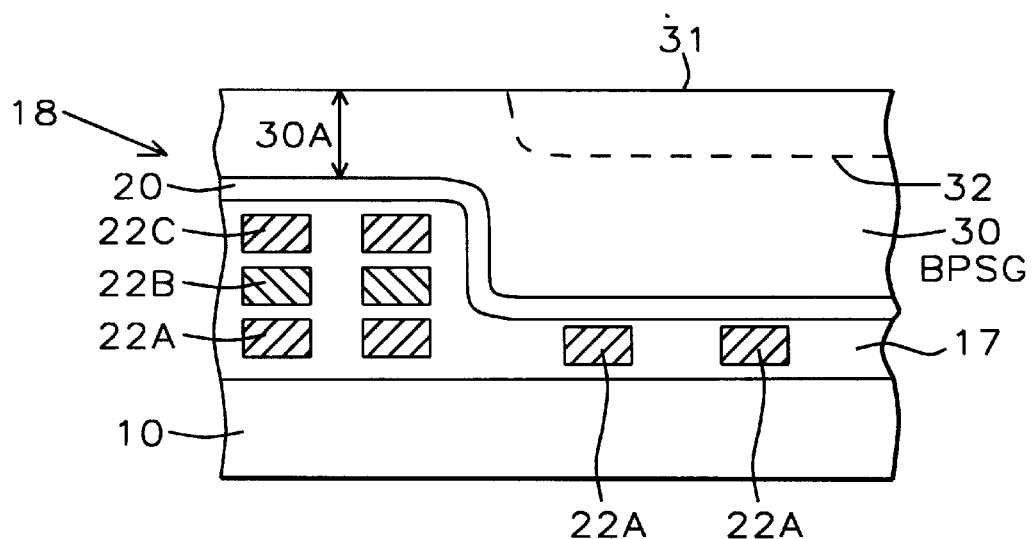

Summary of major steps of the invention:

|   |   |
|---|---|
| | Å and more preferably between 800 and 1200 Å. |
| • | The top surface of the cap layer 40 in the cell area 14 is higher than the top surface of the BPSG layer 30 in the periphery area 16. |
| FIG. 3A - | chemical-mechanical polishing the cap layer 40 and the BPSG layer over the cell area using the cap layer to retard the CMP process when the BPSG layer over the cell area is even with the USG cap layer over the periphery area 16 |
| FIG. 3B - | chemical-mechanical polish continues to remove the cap layer 40 over the peripherial area 16, but not to polish the underlying BPSG layer. |

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not been described in detail in order to not unnecessarily obscure the present invention.

It should be recognized that many publication describe the details of common techniques used in the fabrication process of integrate circuit component. See, E.g., C. Y. Chang, S. M. Sez, in *ULSI Technology*, by The McGraw-Hill Company, Inc. copyright 1997. Those techniques can be generally employed in the fabrication of the structure of the present invention. Moreover, the individual steps of such a process can be performed using commercially available integrated circuit fabrication machines. As specifically necessary for an understanding of the present invention, exemplary technical data are set forth based upon current technology. Future developments in the art may call for appropriate adjustments as would be obvious to one skilled in the art.

As shown in FIG. 2, a semiconductor structure 18 is provided over a semiconductor substrate 10. The semiconductor structure 18 preferably has at least a cell area 14 and a periphery area 16. The semiconductor structure 18 in cell area 14 preferably being higher than the periphery area 16. The cell area can represent any area that is above a lower area on a substrate. The difference in height between the surface of the semiconductor structure 18 in the cell area 14 vs the periphery area 16 is in a range of between about 2000 and 8000 Å and more preferably between about 4000 and 7500 Å.

The cell area (E.g., SRAM or DRAM circuits) can contain devices such as multilayer polysilicon. In contrast, the Periphery 16 (I/O port, amplifier or logic layout) can contain a less polysilicon layer than the cell area. This is why often the cell area 14 is higher than the periphery area 16. The important concept is that there is a height difference between the cell and periphery.

The semiconductor structure 18 is preferably comprised of insulating layers (e.g., 17) and conductive layers (e.g., 22A 22b 22C, etc. could be more layers not shown) that make up part of semiconductor devices. FIG. 2 shows conductive layers 22A, 22B and 22C insulated from each other by First insulating layer 17. Conductive layers 22A (P1)1, 22B (P2) and 22C (P3) preferably represent three polysilicon layers—first poly (P1), second poly (P2) and third poly (P3). Layer 22A preferably represents gates on FET devices. Semiconductor structure 18 is understood to possibly include a semiconductor wafer 10, active and passive devices formed within the wafer (e.g. source and drains) and conductive/insulating layers formed on and over the wafer surface. The term "semiconductor structure" is mean to include devices formed within a semiconductor wafer and the layers overlying the wafer. The term "semiconductor structure surface" is meant to include the upper most exposed layers on a semiconductor wafer, such as a silicon surface, an insulating layer and metallurgy lines.

First insulating layer 17 preferably is composed of silicon oxide or Silicon nitride or can be a multilayer structure composed of several materials. The first insulating layer can represent a gate oxide layer and inter-poly oxide (IPO) layers between the P1, P2 and P3 layers.

Next, a first silicon oxide layer 20 is formed over the semiconductor structure 18. The first silicon oxide layer 20 is preferably formed using a PE-TEOS process and preferably has a thickness in a range of between about 500 and 15,000 Å. Layer 20 can also be formed of several layers of various other materials, such as silicon nitride (SiN). The first oxide layer can represent only a gate oxide layer under the P1 gates (and the BPSG layer 30 can be formed directly on the polysilicon layers (e.g. P1).

Next, a borophosphosilicate glass (BPSG) layer 30 is formed over at least the polysilicon layer 22A and on the first silicon oxide layer 20 (if present) . The BPSG layer 30 is preferably formed by SA $BPO_3$ TEOS (Thermal BPSG process). The BPSG layer 30 preferably has thickness in a range of between about 3000 and 1500 Å. The BPSG preferably has a Boron % in a range of between about 3% and 6% and a P % in a range of between about 2% and 4%. The B concentration and the P concentration are constant throughout the BPSG layer.

The thermal BPSG processes have any advantages over conventional BPSG layers because the thermal process have better step coverage.

TABLE

Preferred BPSG layer 30 process parameters - sub atmospheric chemical vapor deposition (SACVD) process

| Process type-SACVD | units | Low | tgt | hi |
|---|---|---|---|---|
| Thickness | Å | 3000 | 10000 | 15,000 |
| Reactant gasses | atom/cm$^2$ | | | |
| $O_3$ | sccm | 3150 | 4500 | 5800 |
| He | sccm | 4200 | 4500 | 7800 |
| TEOS | mgm | 350 | 500 | 650 |
| TEB | mgm | 135 | 193 | 250 |
| TEPO | mgm | 20 | 34 | 45 |
| pressure | torr | 150 | 200 | 250 |
| temperature | C.° | 400 | 480 | 550 |
| B % conc | wt % | 2 | 4.7 | 6 |
| P % | wt % | 3 | 3.5 | 4.5 |

Note: Mgm = mg per minute of liquid reagent.

Next, a cap layer 40 is formed over the BPSG IDL layer 30. The cap layer 40 is preferably composed of undoped silicon glass (USG). the cap layer can also be formed of Silicon oxynitride (SiON). The USG cap layer 30 is preferably formed using PECVD or sub atmospheric (SA) thermal CVD processes and is preferably formed using a SACVD process. It is important that the cap layer 40 has a thickness that is at less than half of the first thickness of the BPSG layer;

TABLE

Preferred process parameters for the cap layer 40

| Process type-PECVD or SACVD | units | Low | tgt | hi |
|---|---|---|---|---|
| Thickness | Å | 300 | 1000 | 2000 |
| Reactant gasses | | | | |
| $O_3$ | sccm | 700 | 1000 | 1300 |
| He | sccm | 900 | 1200 | 1500 |
| TEOS | mgm | 700 | 1000 | 1300 |
| pressure | TORR | 5.7 | 8.2 | 11 |
| temperature | C.° | 280 | 400 | 520 |
| POWER | watts | 472 | 675 | 878 |

The USG cap layer 40 preferably has a thickness in a range of between about 300 and 2000 Å.

An important parameter to the invention, the USG cap layer 40 has a chemical-mechanical polish rate ratio to the BPSG layer 30 in a range of between about 2:1 and 4:1 and more preferably between about 2.5:1 and 3.5:1.

Also, the cap layer preferably has a thickness that is at less than half of the first thickness of the BPSG layer and more preferably less than ⅕of the thickness of the BPSG layer. The top surface of the cap layer 40 in the cell area 14 is higher than the top surface of the BPSG layer 30 in the periphery area 16; (See FIG. 2 element 35). This is to ensure the chemical-mechanical polish process only polishes the BPSG layer (and not polish the BPSG layer and the cap layer over the periphery area 16 simultaneously for an significant amount of time. Keeping the cap layer 40 thin compared to the BPSG layer accomplishes this. This results in better faster CMP (the BPSG layer polishes faster than the cap layer).

The first silicon oxide layer 20, the cap layer 40 and the BPSG layer 30 can comprise inter poly oxide (IPO) layers between two polysilicon layers. See FIG. 5. The first silicon oxide layer 20, the cap layer 40 and the BPSG layer can comprise an interlevel dielectric (ILD) layers between underlying Poly lines and overlying metal lines. See FIG. 4.

As shown in FIG. 3A, the cap layer 40 and the ILD BPSG layer 30 are chemical-mechanical polished. The cap layer 40 and the BPSG layer are chemical-mechanical polished over the cell area 14 using the cap layer 40 over the periphery area 16 to retard the CMP process when the BPSG layer 30 over the cell area (higher area) 30 is even with the USG cap layer 40 over the periphery area (lower area) 16.

An important difference between the invention and conventional CMP processes is that the invention's the Cap layer 40 to BPSG layer 30 has a CMP selectively of about 1:3. The cap layer is not used as a "hard" stop layer since the CMP can continue through the cap layer. The cap layer is a "compensation or retard layer" as the cap layer retards the CMP in the peripheral area and the cap layer compensates for the cell to periphery thickness variation.

Another important feature of the invention's USG Cap layer 40 is the CAP layer 40 can be left over the semiconductor structure and does not have to be removed. This is contrary to the conventional SIN stop layers that must be removed using a separate etch removal step.

The chemical-mechanical polish process stops before the oxide layer 20 is exposed.

FIG. 3B shows an option where the CAP layer 40 is totally removed by chemical-mechanical polish. The chemical-mechanical polish is stopped after the cap layer 40 is removed. That is the top surface 31 of the BPSG is not polished down. The dotted line 32 shows an example of the top surface to the BPSG layer 30 if the invention's cap layer 40 was not used. The dotted line 32 shows dishing into the BPSG layer. This dishing is eliminated by the invention.

Figure 4:
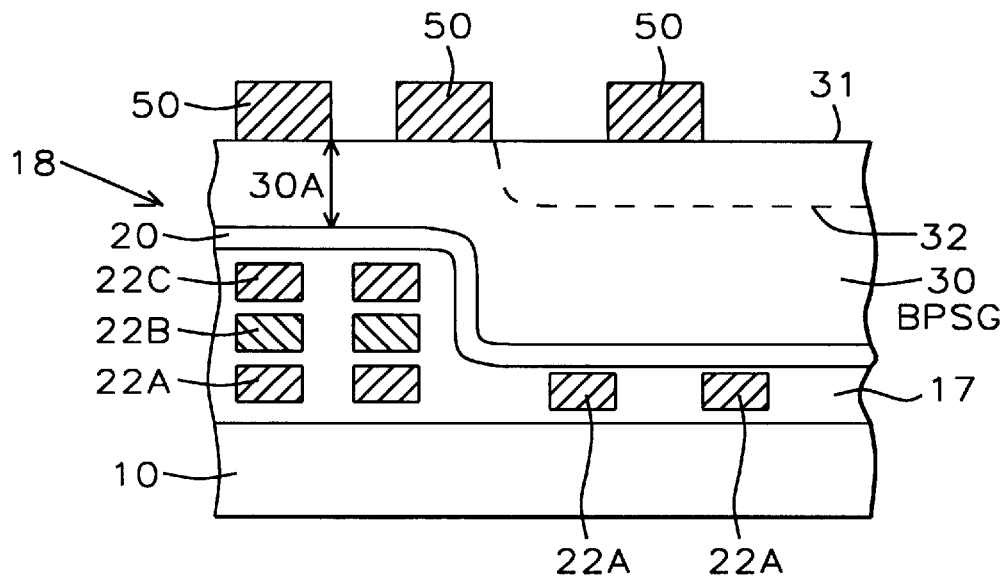

FIG. 4 shows an overlying conductive layer 50 that can be formed of a polysilicon or a metal, such as a AlCuSi alloy. The metal layer can have thickness in a range of between about 3000 and 5000 Å. A polysilicon conductive layer 50 can thickness in a range of between about 1000 and 3000 Å. Also, the cap layer 40 can be completely removed as shown in FIG. 3B and the conductive lines 50 can be formed on the BPSG layer.

Figure 5:
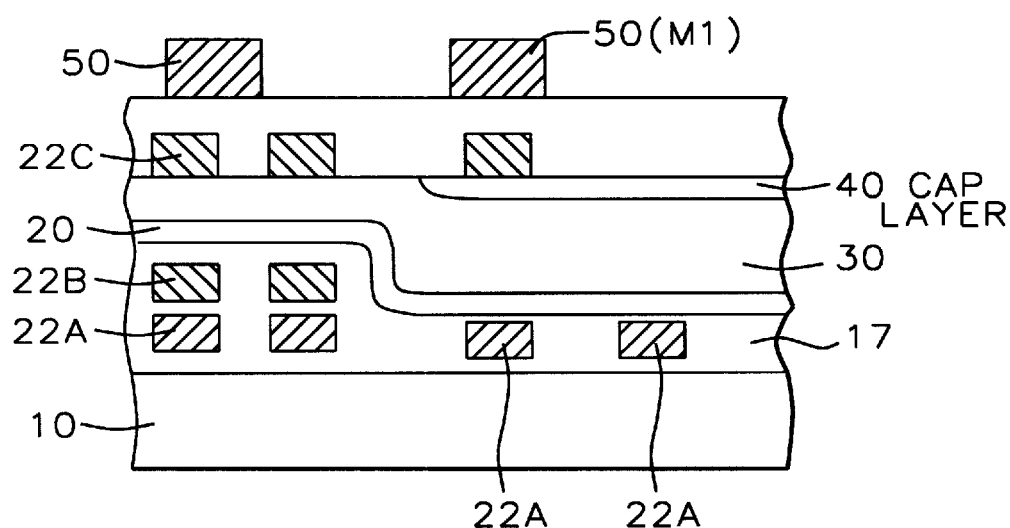
FIG. 5 shows an embodiment where the invention's thin cap layer 40 is between two polysilicon lines according the present invention.

Cap Layer 40 Between Polysilicon Layers—FIG. 5

FIG. 5 shows an embodiment of the invention where the thin Undoped Silicate Glass (USG) cap layer 40 if formed between polysilicon layers. Here the cap layer 40 acts as an inter-poly oxide (IPO) layer. FIG. 5 shows the cap layer 40 between the an underlying polysilicon layer (e.g., P2 22B ) and an overlying polysilicon layer 22C (P3). The number of polysilicon layers and configuration of polysilicon layers can be different than illustrated as known by those skilled in the art.

This contrasts with the cap layer 40 as a inter metal dielectric (IMD) or a interlevel dielectric (ILD ) layer 40 (shown in FIGS. 2 to 4) where the cap layer 40 is between a polysilicon layer and overlying a metal layer 50.

Figure 6:
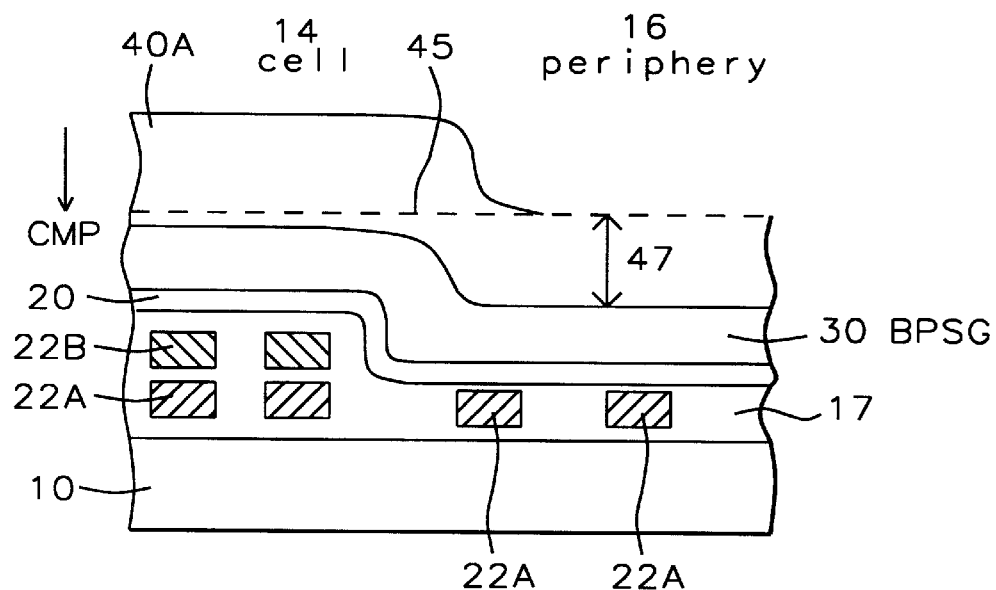
FIGS. 6 and 7 show a thick cap layer 40A that is less preferred embodiment of the invention.
Figure 7:
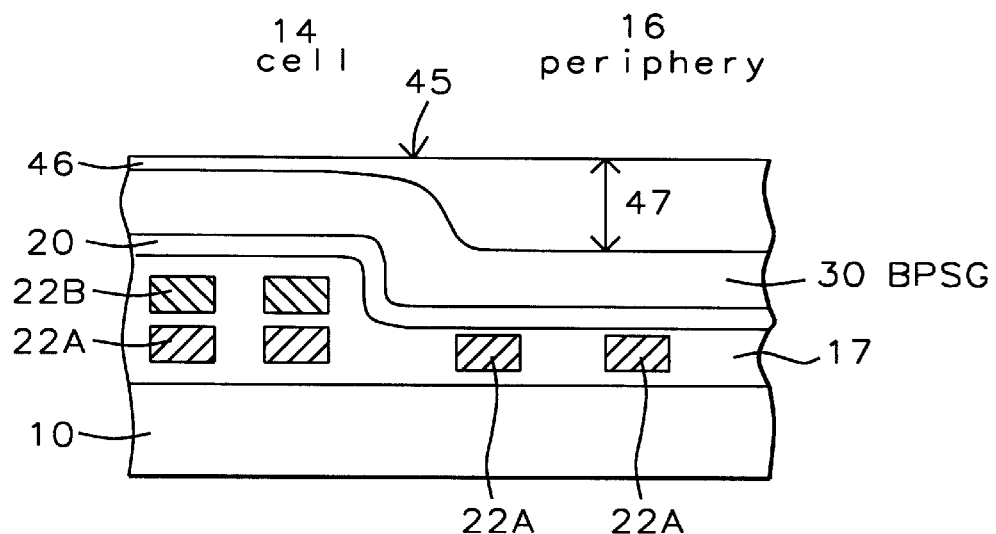

Thick Cap Layer 40A—FIGS. 6 and 7

FIGS. 6 and 7 show a less preferable embodiment of an applicant's previous planarization process. FIGS. 6 and 7 show a thick cap layer 40A. This is in contrast with applicant's preferred embodiment shown in FIGS. 2 through 5 that show a thin Cap layer 40.

FIG. 6 shows the same structure as discussed above with the exception that the cap layer 40A is thick. The thick cap layer 40A has a thickness in a range of between about 5000 and 12,000 Å. The thick cap layer 40A is chemical-mechanical polished down to CMP line 45 that represents the top surface of the thick cap layer 40A over the peripheral area 16.

As shown in FIG. 7, a portion of the cap layer 40A can remain over the cell area or the thick cap layer 40A over the cell area can be completely removed. The portion of the cap layer 40A can remain over the cell area or the thick cap layer 40A has a thickness 46 in a range of between about 1000 and 5000 Å.

The inventor has found that this thick cap layer 40A does not yield as good as resultas as the thin cap layer 40 in the preferred embodiment (FIGS. 2 to 5). The thick cap layer 40A that remains over the periphery area 16 increases the thickness of the IDL layer 20, 30, 40A which degrades the contact and interconnect processes (increases aspect ratio etc.). Also, the thick cap layer 40A (USG) is harder the accurately CMP compared to softer BPSG.

FIG. 7 shows the BPSG layer has a thickness in a range of between about 2000 and 5000 Å. The cap layer 40A has a thickness 46 over the cell area between about 0 and 5000 Å. The cap layer 40A has a thickness 47 over the peripheral area 16 in a range of between about 5000 and 12,000 Å.

In summary, the invention is at least a two layer structure comprising a thick BGSG layer 30 and a thin USG cap layer 40. The cap layer 40 is left on the BPSG layer 30 after the CMP process. A key point of the invention is that the top surface of the cap layer 40 in the cell area 14 is higher than the top surface of the BPSG layer 30 in the periphery area 16 (see FIG. 2 element 35).

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a planarized BPSG layer using a cap layer; comprising the steps of:
   a) providing a semiconductor structure over a substrate; said semiconductor structure having at least a cell area and a periphery area; the surface of said semiconductor structure in said cell area being higher than in said periphery area; said cell area has a plurality of levels of conductive lines surrounded by a dielectric material; forming a first silicon oxide layer over said dielectric material;
   b) forming a BPSG layer over said first silicon oxide layer; said BPSG layer over said periphery area having a first thickness; said BPSG layer having a top surface in said cell area and in said periphery area; said BPSG layer formed by a process of a selected from the group consisting of PE-TEOS and SACVD BPO$_3$ TEOS, and said BPSG layer has a B concentration in a range of between about 3% and 6% and a P concentration in a range of between about 2.0% and 4.5% said B concentration and said P concentration are constant throughout the BPSG layer;, and said BPSG layer has said first thickness in a range of between about 3000 and 15,000 Å;
   c) forming a cap layer composed of undoped silicon glass (USG) over said BPSG layer; said cap layer has a thickness that is at less than half of said first thickness of said BPSG layer; said cap layer having a top surface in said cell area and in said periphery area; Said top surface of said cap layer in said cell area is higher than the top surface of said BPSG layer in said periphery area;
   d) chemical-mechanical polishing said cap layer and said BPSG layer over said cell area using said cap layer over said periphery area to retard the chemical-mechanical polish process when the top surface of said BPSG layer over said cell area is even with said cap layer over said periphery area; and said cap layer remaining over said Periphery area; the chemical-mechanical polishing not exposing said first oxide layer over said cell area.

2. A method of fabrication of a planarized BPSG layer over a semiconductor structure; comprising the steps of:
   a) providing a semiconductor structure over a substrate; said semiconductor structure having at least a cell area and a periphery area; the surface of said semiconductor structure in said cell area being higher than in said periphery area; said cell area has a plurality of levels of conductive lines surrounded by a dielectric material; forming a first silicon oxide layer over said dielectric material;
   b) forming a BPSG layer over said first silicon oxide layer; said BPSG layer over said periphery area having a first thickness; said BPSG layer has a B concentration in a range of between about 3% and 6%, and a P concentration in a range of between about 2.0% and 4.5% said B concentration and said P concentration are constant throughout the BPSG layer;
      (b-1) said BPSG layer has said first thickness in a range of between about 3000 and 15,000 Å;
   c) forming a cap layer is composed of undoped silicon glass (USG) over said BPSG layer; said cap layer has a thickness that is at less than half of said first thickness of said BPSG layer; Said top surface of said cap layer in said cell area is higher than the top surface of said BPSG layer in said periphery area;
      (c-1) said cap layer composed of undoped silicon glass (USG) is formed using of a process selected from the group consisting of plasma enhanced-tetraethoxysilane (PE-TEOS) and sub atmospheric chemical vapor deposition (SACVD);
      (c-2) said cap layer having a thickness in a range of between about 500 and 2000 Å;
   d) chemical-mechanical polishing said cap layer and said BPSG layer over said cell area using said cap layer over said periphery area to retard the chemical-mechanical polish process when the top surface of said BPSG layer over said cell area is even with said cap layer over said periphery area; and said cap layer remaining over said Periphery area; Said BPSG layer over said cell area has a thickness in a range of between about 1000 and 5000 Å and the chemical-mechanical polishing not exposing said first oxide layer over said cell area.

3. A method of fabrication of a planarized BPSG layer over a semiconductor structure; comprising the steps of:
   a) providing a semiconductor structure over a substrate; said semiconductor structure having at least a cell area and a periphery area; the surface of said semiconductor structure in said cell area being higher than in said periphery area; said cell area has a plurality of levels of conductive lines surrounded by a dielectric material; forming a first silicon oxide layer over said dielectric material;
   b) forming a first silicon oxide layer using a PE-TEOS process over said semiconductor structure;
   c) forming a BPSG layer on said first silicon oxide layer; said BPSG layer over said periphery area having a first thickness; said BPSG layer is formed by a process comprising: a O$_3$ flow rate between about 3150 and 5800 sccm; a He flow rate between 4200 and 7800 sccm; a TEOS flow rate between 350 and 650 sccm; a TEB flow rate between 135 and 250 mgm:
      a TEPO flow rate between 20 and 45 mgm; a pressure between 150 and 250 torr; a temperature between 400 and 550° C.; where said BPSG layer has a B % concentration between 2 and 6 Wt % and a P concentration between 3 and 4.5 wt percent;
      (c-1) said BPSG layer has said first thickness in a range of between about 3000 and 15,000 Å;
   d) forming a cap layer composed of undoped silicon glass (USG) over said BPSG layer; said cap layer has a thickness that is at less than one third of said first thickness of said BPSG layer; Said top surface of said cap layer in said cell area is higher than the top surface of said BPSG layer in said periphery area; said cap layer is formed using a process comprising: a O$_2$ flow between 700 and 1300 sccm; He flow between 900 and 1500 sccm; a TEOS flow between 700 and 1300 mgm; a pressure between 5.7 and 11 torr; a temperature between 280 and 520° C.; and a power between 472 and 878 watts;
      (d-1) said cap layer composed of undoped silicon glass (USG) is formed using of a process selected from the group consisting of plasma enhanced-tetraethoxysilane (PE-TEOS) and sub atmospheric chemical vapor deposition (SACVD); and said cap layer having a thickness in a range of between about 500 and 2000 Å;

e) chemical-mechanical polishing said cap layer and said BPSG layer over said cell area using said cap layer over said periphery area to retard the chemical-mechanical polish process when the top surface of said BPSG layer over said cell area is even with said cap layer over said periphery area; and said cap layer remaining over said Periphery area; Said BPSG layer over said cell area has a thickness in a range of between about 1000 and 5000 Å: said USG cap layer has a chemical-mechanical polish rate ratio to said BPSG layer in a range of between about 2.5:1 and 3.5:1; and the chemical-mechanical polishing not exposing said first oxide layer over said cell area.

* * * * *